(12) United States Patent
Lorenz et al.

(10) Patent No.: US 9,874,868 B2
(45) Date of Patent: Jan. 23, 2018

(54) METHOD FOR CALCULATING AN OPTIMIZED TRAJECTORY

(71) Applicant: SIEMENS AKTIENGESELLSCHAFT, München (DE)

(72) Inventors: Ulrich Wolfgang Lorenz, Berlin (DE); Stephan Schäufele, Erlangen (DE)

(73) Assignee: SIEMENS AKTIENGESELLSCHAFT, München (DE)

( * ) Notice: Subject to any disclaimer, the term of this patent is extended or adjusted under 35 U.S.C. 154(b) by 295 days.

(21) Appl. No.: 14/728,538

(22) Filed: Jun. 2, 2015

(65) Prior Publication Data
US 2015/0343733 A1 Dec. 3, 2015

(30) Foreign Application Priority Data

Jun. 3, 2014 (EP) .................................. 14170951

(51) Int. Cl.
| | | |
|---|---|---|
| *G05B 19/418* | (2006.01) | |
| *B30B 15/14* | (2006.01) | |
| *B21D 43/11* | (2006.01) | |
| *B25J 9/16* | (2006.01) | |
| *G06F 17/50* | (2006.01) | |

(Continued)

(52) U.S. Cl.
CPC ........ *G05B 19/41885* (2013.01); *B21D 43/11* (2013.01); *B25J 9/1666* (2013.01); *B30B 15/148* (2013.01); *G05B 19/402* (2013.01); *G05B 19/4069* (2013.01); *G06F 17/5009* (2013.01); *G05B 2219/32014* (2013.01); *G05B 2219/35009* (2013.01); *G05B 2219/40519* (2013.01); *G05B 2219/45142* (2013.01); *Y02P 90/26* (2015.11)

(58) Field of Classification Search
CPC .......................... G05B 19/41885; B21D 43/11
See application file for complete search history.

(56) References Cited

U.S. PATENT DOCUMENTS

| 6,662,067 B1 * | 12/2003 | Xu ................... G05B 19/41825 |
| | | 700/112 |
| 7,636,612 B2 * | 12/2009 | Weber .................... B21D 43/05 |
| | | 700/159 |
| 8,955,789 B2 | 2/2015 | Bitterolf et al. |

(Continued)

FOREIGN PATENT DOCUMENTS

| DE | 10 2005 024 822 A1 | 11/2006 |
| DE | 10 2012 112 172 B3 | 1/2014 |

(Continued)

*Primary Examiner* — Thomas Randazzo
(74) *Attorney, Agent, or Firm* — Henry M. Feiereisen LLC

(57) ABSTRACT

A method for calculating an optimized trajectory with a simulation program and an optimization routine includes making available a trajectory and adjusting it to boundary conditions, implementing a loop having the steps of a provision of one first trajectory, a modification of a (further) trajectory and adjustment of the (further) trajectory on the basis of boundary conditions, using as the optimized trajectory a trajectory which has been made available on the basis of an extremal or predetermined parameter, and, after being calculated, making available the optimized trajectory to a control device in order to move a holder for a component part.

16 Claims, 5 Drawing Sheets

(51) Int. Cl.
  *G05B 19/402*  (2006.01)
  *G05B 19/4069*  (2006.01)

(56) References Cited

U.S. PATENT DOCUMENTS

| | | | | |
|---|---|---|---|---|
| 2008/0109105 A1* | 5/2008 | Weber | ............... | B21D 43/05 |
| | | | | 700/178 |
| 2013/0026278 A1 | 1/2013 | Bitterolf et al. | | |
| 2014/0084607 A1 | 3/2014 | Knoche et al. | | |
| 2015/0294044 A1* | 10/2015 | Schaer | ............... | B21D 43/05 |
| | | | | 700/112 |

FOREIGN PATENT DOCUMENTS

| | | | |
|---|---|---|---|
| EP | | 2 254 013 A1 | 11/2010 |
| WO | WO 2014/063262 A1 | | 5/2014 |

* cited by examiner

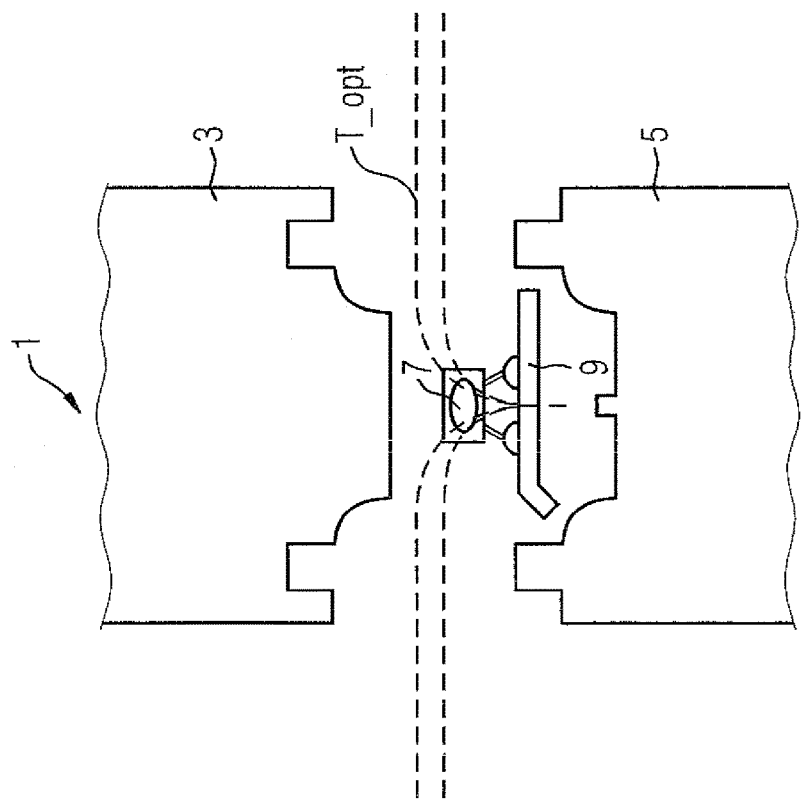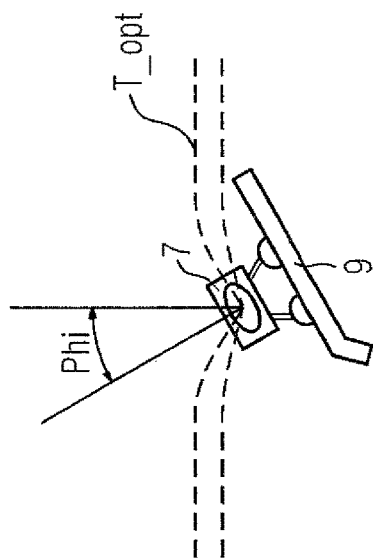

METHOD FOR CALCULATING AN OPTIMIZED TRAJECTORY

CROSS-REFERENCES TO RELATED APPLICATIONS

This application claims the priority of European Patent Application, Serial No. EP 14170951.9, filed Jun. 3, 2014, pursuant to 35 U.S.C. 119(a)-(d), the disclosure of which is incorporated herein by reference in its entirety as if fully set forth herein.

BACKGROUND OF THE INVENTION

The present invention relates to a method for calculating an optimized trajectory of a component part. The invention further relates to a computer program package for executing such a method. The invention also relates to a control device which executes such a method, and also a production machine, in particular a press having such a controller.

The following discussion of related art is provided to assist the reader in understanding the advantages of the invention, and is not to be construed as an admission that this related art is prior art to this invention.

Presses are used diversely in industrial manufacturing in order to process component parts, in particular sheet metal parts, for example for the manufacture of body panels in the automobile industry. Production machines, in particular presses, are for the most part loaded in automated fashion. The loading of the production machine with a component part takes place by means of a holder, where the holder accepts the component part and inserts it into the production machine. The same holder or a further holder removes the component part again after the production process has taken place in the production machine.

In particular in the case of presses the problem arises during the automated insertion of the component part by means of a holder that the component part can only be inserted into the press within a narrow area. In order to prevent a collision of the component part with the press, in particular the press tools, a suitable trajectory is required. Such a trajectory must be regularly created manually prior to loading the press with the component part. To this end geometric parameters of the press and where applicable further parameters are employed as boundary conditions for calculating a trajectory by means of a simulation program. In order to improve a simulated trajectory, the trajectory has been modified by qualified personnel. An improvement in the trajectory is however laborious and requires experienced and qualified personnel.

It would therefore be desirable and advantageous to address prior art shortcomings and to provide a method for automatically optimizing the calculation of a trajectory.

SUMMARY OF THE INVENTION

According to one aspect of the present invention, a method for calculating an optimized trajectory of at least one component part and/or one holder for the component part, in particular for transporting the component part into a production machine and/or out of the production machine, is provided, in which at least one optimization routine is assigned to a simulation program, a first trajectory is calculated using the simulation program on the basis of boundary conditions, a parameter, in particular a velocity, is calculated in the optimization routine from the first trajectory, a modified parameter is determined by means of the optimization routine and a further trajectory is created on the basis of the modified parameter, the further trajectory is modified in a loop, and the loop comprises at least the following:

in a first step the further trajectory is adjusted to the boundary conditions by means of the simulation program and is assigned to the optimization routine, in a second step the parameter is determined on the basis of the further trajectory, in a third step the modified parameter is determined on the basis of the parameter, in a fourth step the further trajectory is calculated on the basis of the modified parameter and the further trajectory is assigned to the simulation program, wherein the loop is executed until such time as the modified parameter reaches a predefined value or an extremal value, and the optimum trajectory is calculated from the extremal value or the predefined value and is adjusted to the boundary conditions by means of the simulation program.

According to another aspect of the present invention, a computer program product is provided for running on a computer system, which has a simulation program, and the simulation program and an optimization routine are provided for executing the method of the present invention as specified above, when the computer program package is loaded and executed on a computer.

According to a further aspect of the present invention, a control device of a production machine is provided for executing the method of the present invention as specified above.

To ensure clarity, it is necessary to establish the definition of several important terms and expressions that will be used throughout this disclosure.

The term "production machine" relates to a press, in particular a servo press, a crimping device, a processing machine and/or a packaging machine. The invention can also be applied in a machine tool. A conveyor facility is advantageously associated with such a production machine.

The term "component part" relates to a metal sheet, a workpiece, a semi-manufactured product, a plastic part or a not yet finished product, which is delivered to a production machine in order to modify the properties thereof. A component part can in particular be a body panel, preferably yet to be formed, for example of a motor vehicle. After the properties have been modified, preferably the shape of the component part, the component part is removed from the production machine again. The conveyor facility is intended for loading and/or for removal of the component part.

The term "trajectory" relates to a spatial path of a holder and/or a component part, in particular into the production machine or out of the production machine. The trajectory further describes the spatial orientation of the component part and/or the spatial orientation of the holder. It is also possible to transport a plurality of component parts by means of one holder and thereby insert them into the production machine or remove them from the production machine again.

A trajectory is a spatial curve wherein individual points of the spatial curve are linked to further variables, wherein the spatial curve can advantageously be deposited and stored in a file, wherein the spatial points demonstrate the locations of the holder and/or of the component part, orientation of the holder and/or of the component part. The further variables are for example the points in time and/or velocities which are associated with the individual points of the spatial curve.

A trajectory can advantageously be represented by, and/or stored as, discrete points, to which where applicable the further variables are assigned, or by coefficients of a function, in particular development coefficients of a series representation of a function. Development coefficients are coefficients which result from a previously defined series representation of the trajectory, for example a Taylor series, a Laurent series or a Fourier series of the trajectory. The term "trajectory" is used in the following to denote a first trajectory, a further trajectory or an optimized trajectory.

The term "first trajectory" relates to a trajectory which has been created without a simulation or in a first simulation with the simulation program. The first trajectory is adjusted in particular by means of a computer program suitable for the purpose, such as a CAD program, to boundary conditions. Advantageously, a first trajectory is for example created manually and/or adjusted by means of a simulation program to boundary conditions. The first trajectory is created for example in such a manner that a component part does not quite touch the edges of the production machine, where applicable with a slight modification of the orientation is inserted into a production machine, and/or is inserted into the production machine or is removed from the production machine at a low velocity.

A further trajectory is a trajectory which has been modified with the aid of an optimization routine and/or with the aid of a simulation program. A modified parameter can be assigned to a further trajectory. A further trajectory emerges from a first trajectory or a further trajectory as a result of a modification.

The term "optimized trajectory" relates to a trajectory which has been created from an extremal parameter, for example a maximum attainable velocity or a maximum attainable stroke rate, and where applicable has been adjusted to the boundary conditions. An optimized trajectory emerges for the most part from a further trajectory which has been modified/optimized at least once. The adjustment to the boundary conditions takes place with the aid of the simulation program. An optimized trajectory signalizes for example that the component part can be inserted into the production machine and/or removed from the production machine particularly quickly along the extremal trajectory.

An optimized trajectory can also signalize that the time taken for delivery of the component part into the production machine and/or for removal of the component part from the production machine and/or for transfer of the component part to a different location is minimal.

An optimized trajectory can also signalize that the period of time taken for delivery of the component part into the production machine and/or for removal of the component part from the production machine and/or for transfer of the component part to a different location corresponds exactly to the period of time which the production machine requires for one cycle at a maximum operating velocity.

The shape of an optimized trajectory possibly depends on the velocity at which the component part and/or the holder execute the trajectory. The component part is attached to the holder in this case. The shape of the trajectory and/or of the advantageous orientation of the component part and/or of the holder may therefore change because loads on the component part and/or the holder due to acceleration thereof modify the shape and/or the position of the component part and/or of the holder by the effect of force.

Boundary conditions are based on the dimensions and variables of the production machine, the component part and/or the holder, and also safety clearances which may need to be observed between the component part and the surface of the production machine. Boundary conditions can be formulated as regions in the space, which regions the component part must not enter. Boundary conditions can also be regions in which the first trajectory, the further trajectories and also the optimized trajectory can be modified. According to the example described here, the boundary conditions are formulated for example as maximum and minimum parameters between which the (modified) parameters are permitted to range. In this situation, dependencies may exist between the maximum and the minimum values of the (modified) parameters and values of further (modified) parameters. The trajectories then advantageously run in regions which are defined by the minimum and/or maximum values of the (modified) parameters.

When the tools of the production machine move while the component part is being inserted into the production machine or while the component part is being removed from the production machine the boundary conditions are dependent on the time.

When for example a press tool of a press executes a periodic movement and the movement is not stopped while the component part is being inserted into the press and/or while the component part is being removed from the press, then the boundary condition exhibits a periodic time dependency.

Maximum rotational speeds of motors, maximum stroke rates of the press, maximum accelerations of the component part and/or of the holder, minimum throughput times and also movement-dependent deformations of the holder and/or of the component part can also constitute boundary conditions.

The term "parameter" relates to an optimizable variable, or a set of optimizable variables, which is/are a property of a trajectory described above. A parameter can be a velocity at which a holder and/or a component part executes the trajectory, a throughput time and/or a stroke rate in the case of a press.

The parameter or the components of the parameter and also the modified parameter or the components of the modified parameter can advantageously be arranged. The number of components of the parameter or of the modified parameter is advantageously based on the trajectory and can fluctuate from trajectory to trajectory.

The term "modified parameter" relates to a parameter which is derived from a further trajectory and/or which has been modified, in particular by the optimization routine. On the basis of a further parameter a further trajectory is created on the basis of a suitable procedure.

The modified parameter can be a number or tuple, emerging from the first trajectory and/or a further trajectory and emerging by means of a calculation rule of the optimization routine.

A calculation rule is for example a genetic algorithm, a generic algorithm, a calculation method which is based on a neural network, or on a calculation method which is based on a predefined sequence of numbers.

The modified parameter is advantageously determined by means of the optimization routine in accordance with a calculation rule referred to above.

The term "extremal value" relates to a parameter which in comparison with a number of modified parameters represents a maximum, a minimum or an optimum. For example, an extremal value is a maximum velocity or a maximum stroke rate or a minimum achievable period of time.

A predefined value is accordingly a predefined maximum velocity of a holder or a maximum executable stroke rate of the production machine, preferably of the press.

An optimization routine is a calculation rule which calculates a further trajectory or an optimized trajectory from an inbound trajectory, for example a further trajectory. The further trajectory created by means of the optimization routine is delivered to the simulation program. An optimization routine can also be written as a script, for example a shell script. An existing simulation program does not therefore necessarily need to be modified. An optimization routine can also be present as a self-contained program, as a script, as an add-on and/or preferably as a subroutine of the simulation program.

According to an advantageous feature of the present invention, the optimization routine can load the first trajectory or the further trajectory from a memory. A parameter can be determined from a first trajectory. A modified parameter can be determined from the further trajectory. The parameter or the modified parameter can be modified by using a calculation rule. The calculation rule advantageously has as its input variables the trajectories, where applicable already created in previous passes, and/or the, already calculated, (modified) parameters. A (new) modified parameter and/or a further trajectory is/are calculated using said input variables by means of the calculation rule. When a modified parameter is calculated, the further trajectory can be created from the modified parameter. Thereafter the further trajectory is either saved and/or delivered to the simulation program.

A plurality of further trajectories are advantageously created by means of the optimization routine, in which case either one of the further trajectories is selected for transfer to the simulation program or the simulation program performs a simulation for a plurality of further trajectories and thereafter again transfers the further trajectory to the optimization routine which has proved to be most suitable as a result of the simulation. A further trajectory which is conveyed to the simulation program can also be selected from a plurality of trajectories. In addition, the majority of the trajectories can also be adjusted to the boundary conditions with the aid of simulation program and a selection made in the further course of the method. A method configured thus is applied for example in the case of a genetic algorithm. The best suited of the further trajectories is that to which the extremal parameter is assigned. Advantageously, only a selection of the calculated modified trajectories, preferably the modified trajectory/trajectories having the best modified parameter/parameters, are transferred to the simulation program.

The simulation program can simulate an insertion into and/or a removal from the production machine of the component part. In this situation a check is made on the basis of the boundary conditions as to whether the first trajectory or the further trajectory created by the optimization routine satisfies the boundary conditions. If the further trajectory does not satisfy the boundary conditions, the trajectory is modified slightly and/or transferred to the optimization routine with a corresponding attribute. If the further trajectory satisfies the boundary conditions, it is transferred to the optimization routine for further modification/optimization. If the optimized trajectory satisfies the boundary conditions, said optimized trajectory is saved with an attribute and/or transferred in the form of coefficients and/or function values to the control device.

A simulation program can also calculate a trajectory for a component part on the basis of boundary conditions which means that the component part can be inserted into the machine at a specified velocity. The simulation program can be part of an optimization routine. The shape and the dimensions of the at least one component part, the shape and dimensions of the production machine, in particular of the press tools, serve as boundary conditions in this case. The boundary conditions ensure that collision-free loading of the production machine with the at least one component part takes place.

A control device of a production machine serves to convert the optimized trajectory into a movement of the holder in order to load the assigned production machine. The control device is advantageously connected to a computing unit by way of a technical data connection, for example a USB connection or a network connection, to a computing unit on which the simulation program and where applicable the optimization routine is installed.

Such a calculation method is advantageous on account of the improved calculation of an optimized trajectory. In particular, if a plurality of modified trajectories is compared with one another, according to the invention an extremal trajectory can be determined which even an experienced person skilled in the art would not have been able to find by manual means.

It is furthermore advantageous that time-dependent extremal trajectories can also be determined by means of the method described here.

In addition, the time required for the optimization of a trajectory is considerably less.

In an advantageous embodiment the first trajectory, the further trajectory and the optimized trajectory as a component has a time or is dependent on the time.

In this document the first trajectory, the further trajectory and also the optimized trajectory are referred to as a trajectory if a trajectory is meant whose properties are shared by all the trajectories mentioned here.

A trajectory can be directly dependent on the time. A path of the component part is then directly dependent on the time. This is the case for example if a component part executes a trajectory during a pass in a different time to a component part which executes a pass along a temporally following trajectory. Within one section of the trajectory the time which the holder and/or the component part requires for this section of the trajectory can likewise be different to the time which the holder and/or the component part require for an equally long but different section of the trajectory. It may thus be necessary to reduce the speed of execution of the trajectory in a region in which the trajectory is strongly curved. The time can be an absolute time, a periodically recurring time span or a response time of the holder.

The trajectory can however also be dependent on parameters which are for their part time-dependent.

The formal representation of the temporal dependency of the trajectory advantageously depends on the embodiment of the optimization routine and/or of the simulation program.

In a further advantageous embodiment the size and shape of the component part, the size and shape of the production machine, the size and shape of the holder and/or a deformation of the component part and/or of the holder are considered as boundary conditions.

Boundary conditions are used by the simulation program in order to avoid a collision between the holder and/or the component part with the production machine, in particular one of the press tools of a press. If the production machine has moving parts which can collide with the holder and/or the component part, the boundary conditions are advantageously dependent on time. Boundary conditions can also be understood as being restrictions on the movements of the holder and/or of the component part and/or on the shape of the trajectory. As a result of the time dependency of the boundary conditions the scope of the possible trajectories is increased.

According to a further advantageous feature of the present invention, the first trajectory, the further trajectory and the optimized trajectory can be a function of the location of the component part and/or the holder, of the orientation of the component part and/or the holder, and/or of the time.

The orientation of the holder and/or the component part is understood as being the (spatial) angle which the component part and/or the holder makes to the vertical. The location is the point at which a specified point of the holder and/or of the component part is situated in the space. The set of spatial points which the specified part of the holder or of the component part passes through can be defined as a trajectory. In addition to the location, the time and the orientation yet further dependencies such as the throughput speed or the acceleration of the component part and/or of the holder can be incorporated into the description of the trajectory.

The trajectory can be given by a multiplicity of points in a space or by coefficients of a specified function (of a spatial curve). With regard to the representation of points, a particularly precise and flexible description of the trajectory is advantageously possible. By contrast, with regard to a representation of the trajectory by coefficients a particularly compact representation of the trajectory is possible.

Particularly advantageously, the trajectories can be made available in both representations. A large number of control devices can thus accept and further process the trajectories, in other words employ said trajectories in order to control the loading of the production machine.

According to a further advantageous feature of the present invention, the optimized trajectory is conveyed as function values and/or as coefficients to a control device.

The control device is used in order to drive the electrical machines, where the production machine is loaded or emptied again with the aid of the electrical machines. A control device can for example be a motor controller for controlling a plurality of motors, coordinated with one another, for example a SIMATIC or a SINUMERIK from the company Siemens AG.

According to a further advantageous feature of the present invention, the parameter and the modified parameter van involve at least a velocity, where the extremal value is a maximum velocity.

The parameter or the modified parameter is calculated in the optimization routine from a first trajectory and/or a further trajectory. To this end, a parameter or a modified parameter is firstly derived in the trajectory assigned to the optimization routine. The parameter is subsequently modified. The further trajectory is determined or calculated from the modified parameter. The parameter or the modified parameter is a measure of the degree of optimization of the (further) trajectory. The parameter advantageously approaches an extremal parameter or a predefined parameter. When the further parameter reaches the extremal parameter or the predefined parameter, the trajectory which has emerged from the extremal or predefined parameter is optimized.

A (modified) parameter can be a velocity, a stroke rate or a minimum clearance between the component part and/or the holder and the production machine. An extremal parameter can be a maximum velocity, which means that the holder and/or the component part execute the trajectory in the shortest possible time. The parameter or the modified parameter can also represent a stroke rate, in particular of a press, or a throughput.

In a particularly operator-friendly embodiment of the computer program package, the method described above starts autonomously after at least one option is chosen, in particular by clicking a button.

The computer program package advantageously serves to execute the method described above, wherein the simulation program often already exists at least as part of the computer program package. The optimization routine can advantageously be integrated into the simulation program. The method described above can advantageously be selected as a menu item on the user interface (human machine interface) of the simulation program. When such an integration of the optimization routine is included, the start can be generated by means of a button. For example, when such a button is clicked the method is started and continues running until the trajectory has become an optimized trajectory. The optimized trajectory is subsequently transferred in the forms set out above to the controller unit.

BRIEF DESCRIPTION OF THE DRAWING

Other features and advantages of the present invention will be more readily apparent upon reading the following description of currently preferred exemplified embodiments of the invention with reference to the accompanying drawing, which show in:

FIG. 1 a press and a component part;
FIG. 2 a holder with a component part.

DETAILED DESCRIPTION OF PREFERRED EMBODIMENTS

Figure 3:
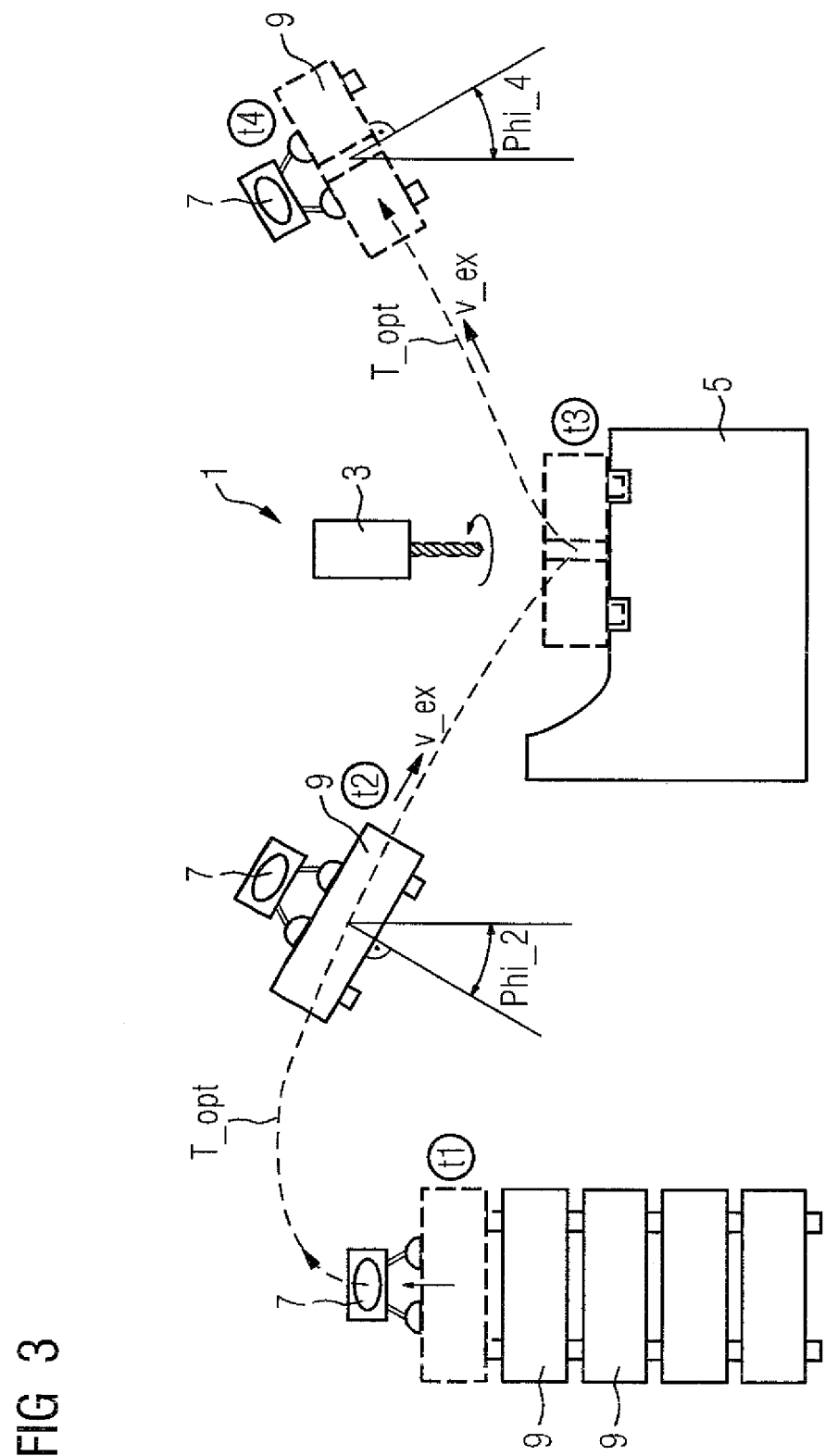
FIG. 3 a production machine and a trajectory.

Throughout all the figures, same or corresponding elements may generally be indicated by same reference numerals. These depicted embodiments are to be understood as illustrative of the invention and not as limiting in any way. It should also be understood that the figures are not necessarily to scale and that the embodiments are sometimes illustrated by graphic symbols, phantom lines, diagrammatic representations and fragmentary views. In certain instances, details which are not necessary for an understanding of the present invention or which render other details difficult to perceive may have been omitted.

Turning now to the drawing, and in particular to FIG. 1, there is shown a press 1 (or another production machine 1) and a component part 9. The component part 9 is situated between the lower tool 5 and the upper tool 3. The component part 9 is inserted by the holder 7 on an optimized trajectory T_opt into the press 1, in other words between the lower tool 5 and upper tool 3. In the press 1 the component part 9 is processed with the aid of the lower tool 5 and with the aid of the upper tool 3. After processing of the component part 9 by the press 1, the component part 9 is gathered by the holder 7 and transported out of the press 1 or the production machine 1. During insertion and during removal of the component part 9 care must be taken to ensure that the component part 9 does not collide with the press 1 in an uncontrolled manner. In order to avoid a collision between the part 9 and/or the holder 7 and the press 1 the holder 7 moves with the component part 9 on a previously specified and/or optimized trajectory T_opt.

FIG. 2 shows a holder 7 with a component part 9. The component part 9 is detachably connected to the holder 9. The holder 7 together with the component part 9 follows the optimized trajectory T_opt. The component part 9 and the holder 7 exhibit the spatial orientation Phi. The spatial orientation Phi of the component part 9 and/or of the holder 7 can change during the passage along the trajectory T_opt. The component part 9 is advantageously detachably connected to the holder 7. The component part 9 can also have its orientation Phi changed by means of the holder 7 in comparison with the orientation of the holder 7.

FIG. 3 shows a production machine 1 and a trajectory T_opt. At point in time t1 component parts 9 are gathered by the holder 7 and transported along the trajectory T_opt into the production machine 1. In this situation the component part 9 and the holder 7 pass along the trajectory T_opt. At point in time t2 the component part 9 is aligned in its orientation Phi_2 with the aid of the holder. At point in time t2 the component part 9 and the holder 7 have a velocity v. The velocity is advantageously a function of the time t and/or the position or the orientation Phi of the component part. The component part 9 is inserted by the holder 7 into the production machine 1, in particular into the lower tool 5 of the production machine 1. The component part 9 is processed by the upper tool 3 in the production machine 1. A drill 3 or a part of a milling machine 3 serves here as the upper tool 3. After processing has taken place in the production machine 1 the holder 7 gathers the component part 9 again at point in time t3 and removes it from the production machine 1 along an optimized trajectory T_opt. At point in time t4 the component part 9 is on the way to a new station. At each point in time t1, t2, t3, t4 the component part has a velocity v. At point in time t2 the component part 9 and the holder 7 have an orientation Phi_2. At point in time t4 the component part 9 and the holder 7 have an orientation Phi_4. The velocity v in this case represents a parameter v, v' which significantly influences the speed of production. The orientation of the workpiece 9 and/or the holder 7 at any point in time is predefined by the orientation Phi.

Figure 4:
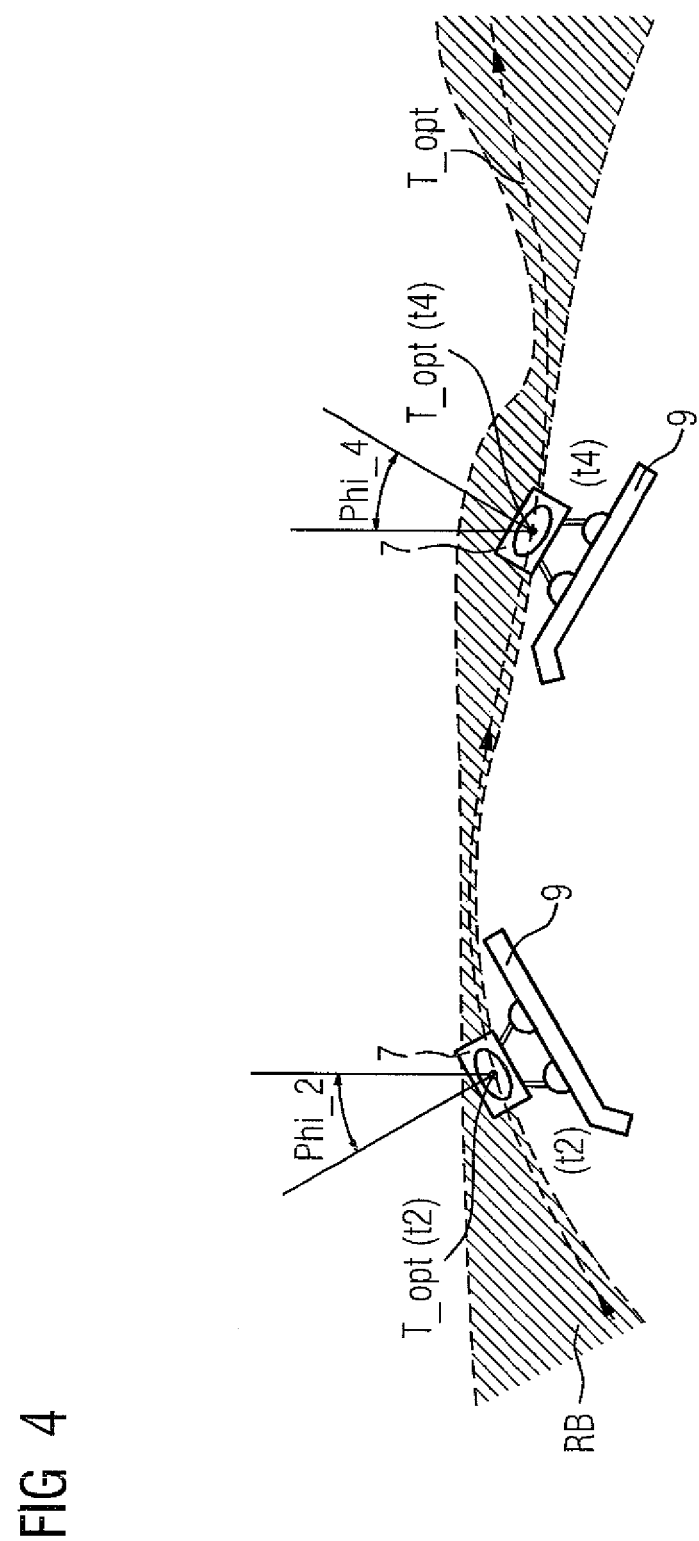
FIG. 4 a holder with a component part.

FIG. 4 shows a holder 7 and a component part 9. The component part 9 is held by the holder 7 at point in time t2 at a particular spatial point T_opt(t2) and passes along the optimized trajectory T_opt through the zone restricted by the boundary conditions RB which is indicated by the hatching. The trajectory T, T_opt can run between the dashed lines. The figure shows the holder 7 and the component part 9 at point in time t2 with an orientation Phi_2 and at a further point in time t4 with a different orientation Phi_4. In this drawing the component part 9 is fixedly and rigidly connected to the holder 7. It is also possible that the orientation Phi of the component part 9 is at least partially also determined by the holder 7, in other words that the holder 7 has an orientation Phi_2, Phi_4 at a point in time t2, t4 and the component part 9 adopts a different orientation Phi in the space, in which case the orientation Phi of the holder 7 and which differs from the orientation Phi jointly present at points in time $t_1$ and $t_2$ with regard to a rigid holder 7 of the component part 9 by the use of the holder 7.

Figure 5:
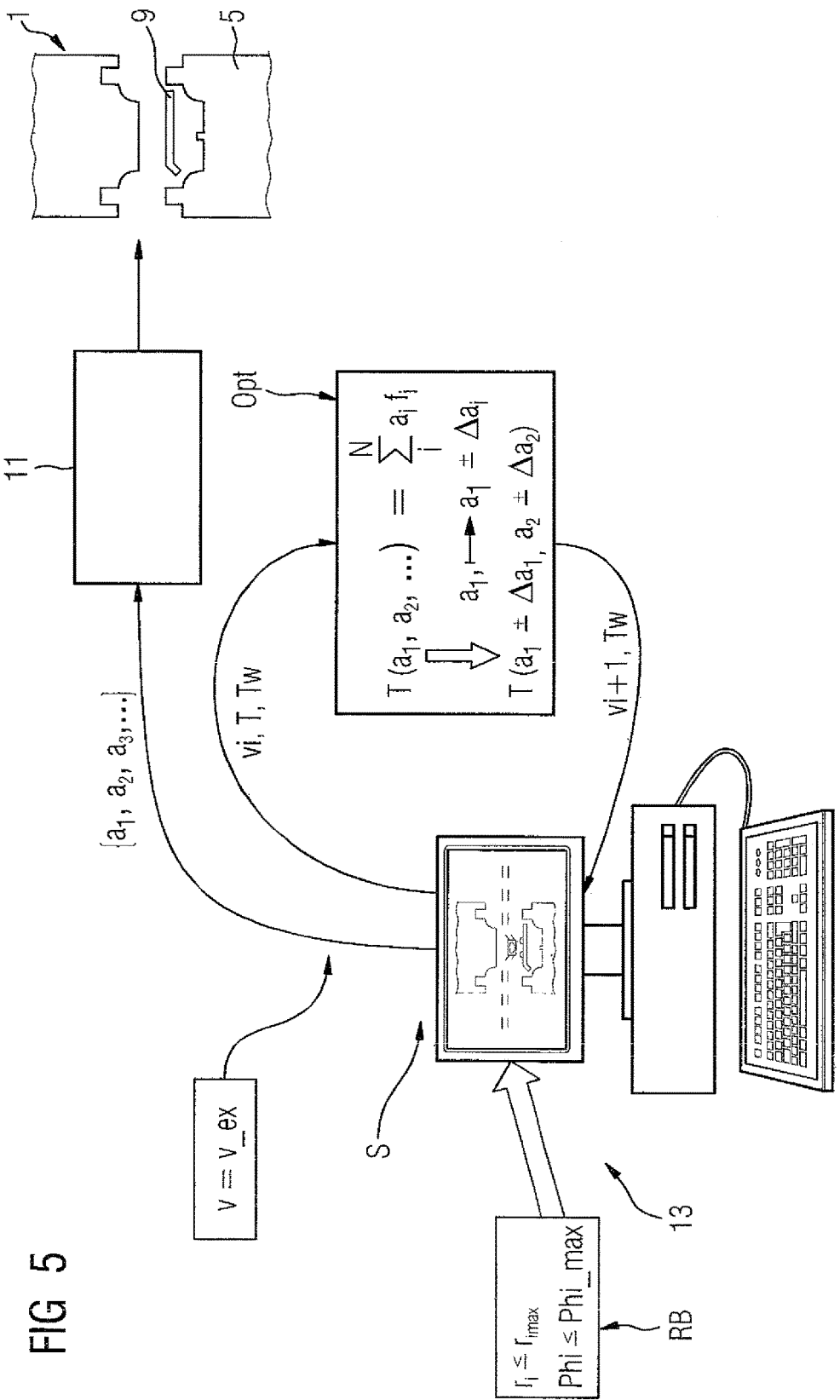
FIG. 5 a diagram for calculating an optimized trajectory.

FIG. 5 shows a diagram for calculating an optimized trajectory T_opt. It shows a computing unit 13, for example a personal computer 13, on which the simulation program S is installed and runs. The calculation of the optimized trajectory T_opt takes place with the aid of the simulation program S and/or the optimization routine Opt. The optimization routine Opt is furthermore also installed on the computing unit 13. Although the optimization routine Opt can be part of the simulation program S, the optimization routine Opt is illustrated separately from the simulation program S. The method starts with the specification of a first trajectory T1, for example manually by a user. The first trajectory T1 can also have been created through specifications by the user with the simulation program S. In addition boundary conditions RB are predefined, in which case the boundary conditions RB can advantageously also have been determined from CAD drawings of the production machine 1, of the at least one component part 9 and also where, applicable of further variables by means of the simulation program S. A parameter v is determined, here advantageously by the simulation program S, when the method is executed for a first time. It is also possible to determine the parameter v with the aid of the optimization routine Opt. After calculation of the (first) trajectory T1, the (first) trajectory T1 and where applicable the parameter v or the further parameter vi is conveyed to the optimization routine Opt. In the optimization routine Opt, in an advantageous manner a representation of the trajectory $T(a_1, a_2, \ldots)$ is made available, for example a series representation. The coefficients $a_i$, $i=1, \ldots, N$ of the series representation of the trajectory $T(a_1, a_2, \ldots)$ are modified in a further step in accordance with a deterministic or probabilistic diagram. For example, the individual coefficients $a_1$ are increased $a_i + \Delta a_i$ or reduced $a_i - \Delta_i$. A modified trajectory $T(a_1 + \Delta a_1, a_2 \pm \Delta a_2, \ldots)$ is created from the coefficients $a_i \pm \Delta a_i$ thus modified. The modified trajectory $T(a_1 \pm \Delta a_1, a_2 \pm \Delta a_2, \ldots)$ is advantageously again normalized to the first trajectory $T(a_1, a_2, \ldots)$.

The modified trajectory $Tw = T(a_1 \pm \Delta a_1, a_2 \pm \Delta a_2, \ldots)$ is then transferred to the simulation program S. The simulation program arranges the modified/further trajectory Tw such that the boundary conditions RB are observed. The simulation program S is advantageously in a position to compare the further trajectory Tw with the preceding trajectory T on the basis of the new properties of the former. The parameter vi, vi+1, v, v' is used for example as a standard of comparison. If the parameter vi, vi+1, v, v' is for example the velocity vi, vi+1, v, v' at which the component part 9 is inserted into and/or removed again from the production machine 1, then the modification of the trajectory T, Tw is to be regarded a step in the right direction towards the shape of the optimized trajectory T_opt.

The loop described above is executed until such time as the changes $\Delta ai$ to the modified parameter vi, vi+1 drop beneath a predefined value or as soon as the modified parameter undershoots a predefined range after execution of the loops. The trajectory T and the further trajectory can be transferred between the simulation program S and the optimization routine Opt in the form of parameters v, v+1, as trajectories T, Tw and/or in the form of coefficients a1, a2, . . . .

The optimized trajectory T_opt obtained in the last pass of the loop is conveyed to the control device 11 in the form of coefficients $a_1, a_2, \ldots$ when the extremal parameter v_ex is reached. The control device 11 controls the loading of the production machine 1 with component parts, in particular by controlling 11 the executed optimized trajectory T_opt of the holder 7 for the component part 9.

Figure 6:
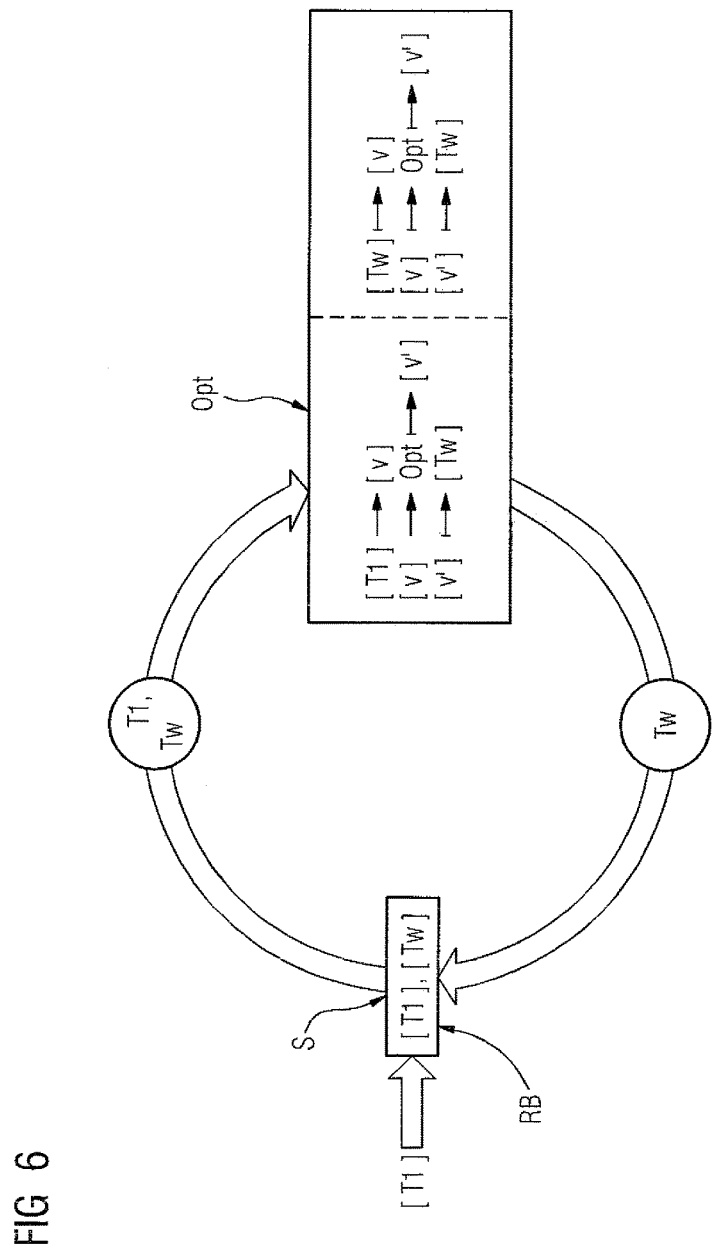
FIG. 6 a diagram for calculating a further trajectory.

FIG. 6 shows a diagram for calculating a further trajectory Tw. In particular, a diagram of the first pass of the loop for calculating the optimized trajectory T1 is disclosed here. Starting from a first trajectory T1, a check is performed with the aid of the simulation program S as to whether the first trajectory T1 satisfies the boundary conditions RB. If the boundary conditions RB are not satisfied by the first trajectory T1, the first trajectory T1 is adjusted with the aid of the simulation program S. The first trajectory T1 is then conveyed to the optimization routine Opt. With the aid of the optimization routine a parameter v is determined from the first trajectory T1 (and/or a further trajectory Tw). The parameter v is modified with the aid of the optimization routine Opt into a modified parameter v'. A further trajectory Tw is created with the aid of the modified parameter v'. The further trajectory Tw is transferred to the simulation program S. The further trajectory is adjusted to the boundary conditions RB with the aid of the simulation program S. After adjustment of the further trajectory Tw has taken place, the latter is transferred again to the optimization routine, where a parameter v is created in the further trajectory Tw by means of the optimization routine Opt. The parameter v is transformed with the aid of the optimization routine Opt into a modified parameter v'. A further trajectory Tw is created with the aid of at least the modified parameter v'.

When the further trajectory Tw and/or the modified parameter v' are/is being created, (modified) parameters v, v' and/or already created and where applicable saved (further) trajectories T1, Tw can also be taken into consideration.

As soon as the modified parameter v' has reached a particular value v_ex or particular values v_ex, then the optimized trajectory T_opt can be determined from the further trajectory Tw. The latter is checked again where applicable against the boundary conditions RB. The optimized trajectory is then made available for the control device 11 of the production machine 1.

The method presented can in particular advantageously be employed in order to execute a so-called press line simulation.

A representation of a simulation scenario takes place in this case by means of the simulation program. Examples of a simulation scenario are the setup of a press 1 or of a production machine 1 or of a collision analysis. The modification of the parameters v, v' advantageously takes place by taking into consideration a transfer curve (trajectory T, further trajectory Tw, or optimized trajectory T_opt).

The results of a method presented here are for example a collision report, a parts list of the component parts 9 to be transported with the holder 7, a list of the programming values and/or a simulation video or an image sequence.

The method for calculating an optimized trajectory is advantageously performed in two steps:
On the one hand, a modification of variables such as the trajectory T, Tw, T_opt until no further collision of the component part 9 and/or of the holder occurs with a further element, in particular the production machine 1 and/or the press 1.
On the other hand, an optimization of the velocity v, v', v_ex of the component part 9 along such a trajectory T, Tw, in particular an optimized trajectory T_opt and/or an optimization of the stroke rate v, v', v_ex of a press 1 or of the production machine 1.

A so-called solver advantageously serves as the basis for an optimization method. A solver is preferably open source software which contains a general optimization algorithm and can be adapted for the case in question. Such an adaptation advantageously takes place by specifying all manner of parameters, values which influence the solver, and also by adding appropriate program code to said solver software. An addition can also take place in a so-called software add-on.

Trajectories T, T1, Tw, T_opt are often also referred to as transfer curves or transport curves. These are continually adjusted during the simulation with the aid of the simulation program S, where applicable with the aid of an optimization routine Opt presented here, until an optimum is achieved. A method described here can advantageously be performed after setup of the manufacturing facility which has a production machine 1. Thereafter, when the manufacturing facility is operating, only slight further adjustment of the optimized trajectory takes place.

Advantageous variables for the parameters or for the boundary conditions are clearance values to be observed between component part 9/holder 7 and the further elements (such as the production machine 1). Further parameters also advantageously based on the orientation (rotational values) of the component part 9, start times ti, t and/or end times ti, t of the component part 9 and/or the holder 7 during the passage along the (optimized) trajectory T, Tw, T_opt.

Advantageously, a variation of the number of the so-called support points of the (optimized) trajectory T, T_opt, Tw also takes place. Support points are spatial points which define/span the (optimized) trajectory T, T1, Tw, T_opt.

To summarize, the invention relates to a method for calculating an optimized trajectory T_opt with the aid of a simulation program S and an optimization routine Opt. During the method the trajectory T, T1, Tw is made available with the aid of a simulation program and adjusted to boundary conditions RB. The method has a loop, wherein the loop implements
the provision of a first trajectory T1,
the modification of the (further) trajectory T1, Tw,
and the adjustment of the (further) trajectory T1, Tw, T on the basis of boundary conditions RB
as individual steps. The optimized trajectory T_opt is a trajectory T, Tw which has been made available on the basis of an extremal or predetermined parameter v', v_ex. After being calculated, the optimized trajectory T_opt is made available to a control device 11 in order to move a holder 7 for a component part 9.

While the invention has been illustrated and described in connection with currently preferred embodiments shown and described in detail, it is not intended to be limited to the details shown since various modifications and structural changes may be made without departing in any way from the spirit and scope of the present invention. The embodiments were chosen and described in order to explain the principles of the invention and practical application to thereby enable a person skilled in the art to best utilize the invention and various embodiments with various modifications as are suited to the particular use contemplated.

What is claimed as new and desired to be protected by Letters Patent is set forth in the appended claims and includes equivalents of the elements recited therein:

1. A method for calculating an optimized trajectory of at least one component part and/or one holder for the component part, comprising:
assigning at least one optimization routine to a simulation program;
calculating, with the simulation program, a first trajectory by taking into account boundary conditions;
calculating, in the optimization routine, a parameter from the first trajectory;
determining with the optimization routine a modified parameter and generating at least one further trajectory on the basis of the modified parameter;
modifying the further trajectory in a loop, wherein the loop comprises at least the following steps:
adjusting, with the simulation program, the further trajectory to the boundary conditions and assigning the further trajectory to the optimization routine,
determining the parameter on the basis of the further trajectory,
determining the modified parameter on the basis of the parameter, determining the further trajectory on the basis of the modified parameter and assigning the further trajectory to the simulation program, executing the loop until such time as the modified parameter reaches a predefined value or an external value;

calculating the optimized trajectory from the external value or from the predefined value;

adjusting, with the simulation program, the optimized trajectory to the boundary conditions; and transforming the optimized trajectory into function values or into coefficients, said coefficients resulting from a previously defined series representation of the trajectory selected from the group consisting of a Taylor series, a Laurent series, and a Fourier series of the trajectory.

2. The method of claim 1, wherein the first trajectory, the further trajectory and the optimized trajectory has a time as a component or is dependent on the time.

3. The method of claim 1, wherein the first trajectory, the further trajectory and the optimized trajectory is a function of at least one of a variable selected from a location of the component part or a holder, an orientation of the component part or the holder, and a time.

4. The method of claim 1, wherein the function values or coefficients are conveyed to a control device.

5. The method of claim 1, wherein the parameter and the modified parameter are velocities, and wherein the external value is a maximum velocity.

6. The method of claim 1, further comprising using the method for calculating the optimized trajectory of the at least one component part for transporting the component part into a production machine and/or out of the production machine.

7. The method of claim 6, wherein the boundary conditions comprise at least one variable selected from a size and shape of the component part, a size and shape of the production machine, a size and shape of a holder, and a deformation of at least one of the component part and the holder.

8. A simulation program embodied in a non-transitory computer readable medium and comprising an optimization routine for calculating an optimized trajectory of a workpiece, the optimization routine being provided for executing a method as claimed in claim 1, when the simulation program is loaded and executed on a computer.

9. A control device of a production machine configured for executing a method as claimed in claim 1.

10. A computer program product embodied in a non-transitory computer readable medium, wherein the computer program product comprises a simulation program for calculating an optimized trajectory of a workpiece, with the simulation program, when loaded into a memory of a computer, causing the computer to perform the step of executing the simulation program and an optimization routine for carrying out a method as claimed in claim 1.

11. The computer program product of claim 10, wherein the method as claimed in claim 1 starts autonomously after selecting at least one option.

12. The computer program product of claim 11, wherein the at least one selected option comprises clicking a button.

13. A production machine, comprising a control device as claimed in claim 9.

14. The production machine of claim 13, configured as a press.

15. A production machine, comprising a control device configured to obtain coefficients and/or function values which have been calculated using a computer program product as claimed in claim 10.

16. The production machine of claim 15, wherein the production machine is a press.

\* \* \* \* \*